United States Patent [19]
Ueno

[11] Patent Number: 6,054,352
[45] Date of Patent: Apr. 25, 2000

[54] METHOD OF MANUFACTURING A SILICON CARBIDE VERTICAL MOSFET

[75] Inventor: Katsunori Ueno, Kanagawa, Japan

[73] Assignee: Fuji Electric Co., Ltd., Japan

[21] Appl. No.: 09/027,305

[22] Filed: Feb. 20, 1998

[30] Foreign Application Priority Data

Feb. 20, 1997 [JP] Japan .................................. 9-036080

[51] Int. Cl.⁷ .............................................. H01L 21/336
[52] U.S. Cl. ..................... 438/268; 438/197; 438/931; 438/285; 438/138; 257/77
[58] Field of Search ...................... 438/931, 138, 438/140, 105, 197, 268, 299, 133, 135, 139, 285; 257/76, 77, 288, 368, 335, 336

[56] References Cited

U.S. PATENT DOCUMENTS

| | | | |
|---|---|---|---|
| 5,338,945 | 8/1994 | Baliga et al. | 257/77 |
| 5,393,999 | 2/1995 | Malhi | 257/289 |
| 5,486,484 | 1/1996 | Malhi | 437/41 |
| 5,814,859 | 11/1995 | Ghezzo et al. | 257/335 |
| 5,877,041 | 6/1997 | Fuller | 438/105 |
| 5,877,515 | 9/1996 | Ajit | 257/76 |

OTHER PUBLICATIONS

A Critical Look at the Performance Advantages and Limitations of 4H–SiC Power UMOSFET Structures, A.K. Agarwal, Westinghouse Science & Technology Center, Bethlehem, Pa. pp. 119–122. (no date).

Current–Voltage and Capacitance–Voltage Characteristics of Metal/Oxide/6H–Silicon Carbide Structure, Norihito Tokura, Jpn J. Appl. Phys. vol. 34 (1995) pp. 5567–5573.

Part 1. No. 10, Oct. 1995.

High_Voltage Double_Implanted Power MOSFETs n 6H–Sic Jayarama N. Shenoy, 54th Device Research Conference (Santa Barbar, Jun. 1996).

*Primary Examiner*—Charles Bowers
*Assistant Examiner*—Evan Pert
*Attorney, Agent, or Firm*—Rossi & Associates

[57] ABSTRACT

A method of manufacturing a silicon carbide vertical MOSFET is presented which includes: providing a first conductivity type silicon carbide substrate; a first conductivity type drift layer comprising silicon carbide which is formed on the first conductivity type silicon carbide substrate; a second conductivity type base region formed in a selected region of a surface layer of the first conductivity type drift layer; a first conductivity type source region formed in a selected region of the second conductivity type base region; a gate electrode layer formed on a gate insulating film over at least a part of an exposed surface portion of the second conductivity type base region interposed between the first conductivity type source region and the first conductivity type drift layer; a source electrode formed in contact with surfaces of the first conductivity type source region and the second conductivity type base region; and a drain electrode formed on a rear surface of the silicon carbide substrate. In the manufacture of the vertical MOSFET, the first conductivity type source region is formed by ion implantation of first conductivity type impurities using a first mask, and the second conductivity type base region is formed by ion implantation of second conductivity type impurities using a second mask that has a smaller width than the first mask.

4 Claims, 9 Drawing Sheets

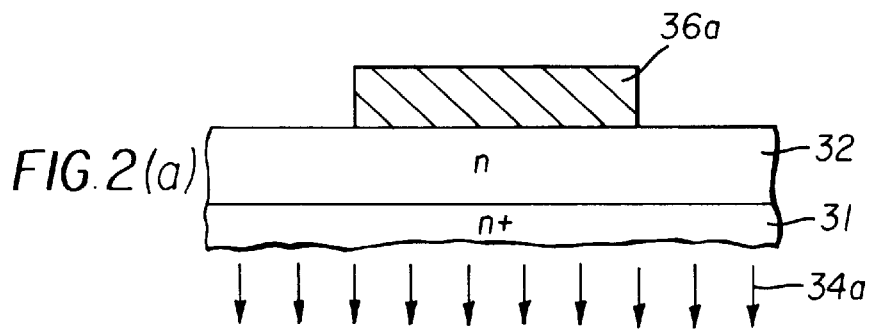
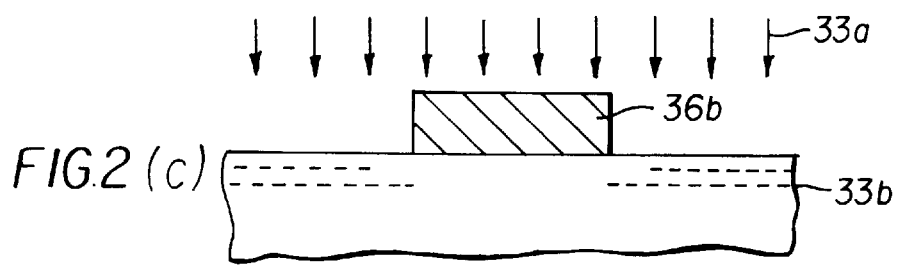
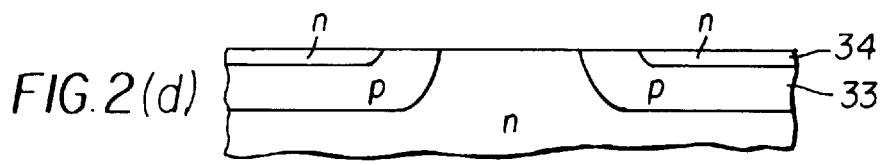
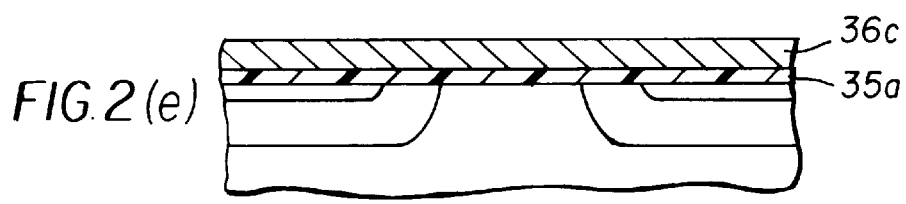
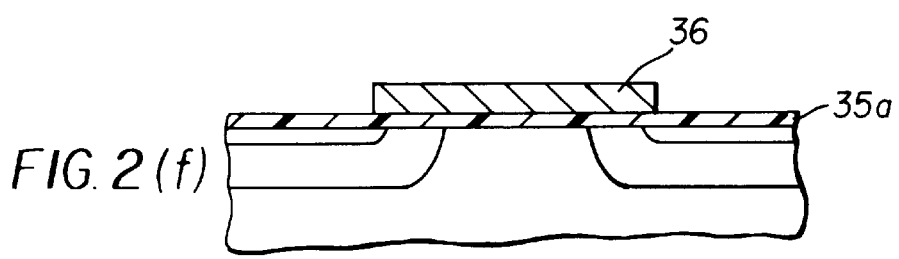

METHOD OF MANUFACTURING A SILICON CARBIDE VERTICAL MOSFET

FIELD OF THE INVENTION

The present invention relates to power semiconductor devices, in particular, vertical MOSFETs having MOS type gates, which use silicon carbide as a semiconductor material, and a method for manufacturing such semiconductor devices.

BACKGROUND OF THE INVENTION

Silicon carbide (that will be referred to as SiC) has a wide band gap, and its maximum breakdown electric field is larger than that of silicon (that will be referred to as Si) by one order of magnitude. Thus, SiC has been considered as a material advantageously used for power semiconductor devices in the next generation. Such devices as Shottky diodes, vertical MOSFETs, and thyristors, using SiC as a semiconductor material have been proposed, and it has been confirmed that these devices exhibit far more excellent characteristics than known devices using Si. The present invention is particularly concerned with a SiC vertical MOSFET, among the above-indicated devices.

FIG. 7 is a cross sectional view of a unit cell of a planar type vertical MOSFET, which is the most prevailing type of power semiconductor device using Si. When a voltage is applied to a gate electrode layer 6 on a gate insulating film 5, a channel 10 is induced in a surface portion of a p base region 3 right under the gate electrode layer 6, and an n source region 4 and an n drift layer 2 are electrically shorted. As a result, current is allowed to flow from a drain electrode 8 formed on the rear surface of an n⁺ substrate 1 under the n drift layer 2, to a source electrode 7 formed on the surface of the n source region 4. When the voltage applied to the gate electrode layer 6 is removed, the drain electrode 8 and source electrode 7 are electrically disconnected from each other. Thus, the vertical MOSFET of FIG. 7 performs a switching function by applying and removing voltage to and from the gate electrode layer 6.

FIG. 9(a) through FIG. 9(f) are cross sectional views showing the flow of the process of fabricating the structure as described above. The process shown in these figures is only a part of the whole process of producing the semiconductor device, in particular, a process of forming junctions that relates to the present invention.

Initially, the n drift layer 2 having high resistance is epitaxially grown on the n⁺ substrate 1, and the gate insulating film 5 in the form of a silicon dioxide film (referred to as "SiO₂ film") is formed by thermal oxidation on the surface of the n drift layer 2. Then, a polycrystalline silicon layer 6a is deposited on the gate insulating film 5, as shown in FIG. 9(a). The polycrystalline silicon layer 6a is then formed in a given pattern by photolithography to provide the gate electrode layer 6, as shown in FIG. 9(b).

Subsequently, p-type impurities, such as boron ions 3a, are implanted, as shown in FIG. 9(c), and the implanted boron atoms 3b are activated and diffused by heat treatment to form the p base region 3, as shown in FIG. 9(d).

Further, n-type impurities, such as phosphorous ions 4a, are implanted, as shown in FIG. 9(e), and the implanted phosphorous atoms 4b are activated and diffused by heat treatment to form the n source region 4, as shown in FIG. 9(f).

In the following steps that are not illustrated, phosphorous glass is deposited by reduced-pressure chemical vapor deposition (CVD) to provide an insulating film, and an opening or window is formed through the insulating film, so that the source electrode 7 is formed in contact with the n source region 4. At the same time, a gate electrode is formed in contact with the gate electrode layer 6, and a drain electrode is provided on the rear surface of the n⁺ substrate 1.

What is most important in the above-described process is as follows: in the process of implanting the p-type boron ions 3a and n-type phosphorous ions 4a, the gate electrode layer 6 formed in the previous step serves as a mask during ion implantation, and both types of ions are introduced into the n drift layer 2 using the same mask, and then thermally diffused. The thus formed structure is called double diffusion MOS (D-MOS) structure. In this manner, the length of the channel region 10 that greatly influences characteristics of the MOSFET can be controlled with considerably high accuracy, thus assuring a high yield in the manufacture of the MOSFET.

The above-described process has been most widely employed to produce MOSFETs using Si as a semiconductor material, but cannot applied as it is when producing MOSFETs using SiC. This is because SiC has poor ability to activate impurities introduced by ion implantation, and, in order to improve this ability, ion implantation at 1000° C. or higher and heat treatment for activation at 1600° C. or higher are needed. In addition, the impurities introduced by ion implantation hardly diffuses in the SiC substrate.

While SiO₂ film is normally used as a gate insulating film, and polycrystalline silicon is used as a gate electrode, the SiO₂ film softens at 1300° C. or higher, and polycrystalline silicon has a fusing point of 1412° C. Accordingly, heat treatment cannot be implemented at such high temperatures as indicated above after the gate insulating film 5 and gate electrode layer 6 are formed, as in the process of FIG. 9(a) through FIG. 9(f).

In view of the above problem, trench-type MOSFETs have been proposed which use SiC substrates. FIG. 10 is a cross sectional view showing a unit cell of a known example of trench-type MOSFETs.

In the structure shown in FIG. 10, a p base layer 13 is formed by epitaxial growth, rather than by diffusing impurities. After an n source region 14 is formed by implantation of phosphorous ions, for example, a trench 19 is formed which extends from the surface of the n source region 14 down to n drift layer 12. Gate insulating film 15 is formed on the inner wall of the trench 19, and a gate electrode layer 16 is formed to fill the interior of the trench 19. The thus formed structure may be also advantageously employed as a Si device. This is because channel regions 20 are formed in the vertical direction in this structure, thus allowing cells to be closely positioned with high area efficiency, and the resulting device exhibits improved characteristics due to its geometry.

When the above structure is employed in SiC devices, however, there arises another problem as follows. The boundary condition of the electric field strength at the interface between the semiconductor and the gate insulating film upon application of voltage is represented by:

$$\epsilon_i E_i = \epsilon_s E_s \quad (1)$$

where $\epsilon_i$, $\epsilon_s$ are dielectric constants of the gate insulating film and semiconductor, respectively, and $E_i$, $E_s$ are electric field strengths of the gate insulating film and semiconductor, respectively. Accordingly, the electric field of the gate insulating film is represented by the following equation:

$$Ei = \frac{\epsilon s}{\epsilon i} \cdot Es$$

Since ∈S of Si is 11.7 and ∈i of the SiO$_2$ film is 3.8, an electric field that is about 3 times as much as that of Si substrate is applied to the gate insulating film even in the case where a breakdown electric field is applied to the Si substrate. This electric field is equivalent to about 30% of the breakdown electric field of the gate insulating film. On the other hand, the ∈S of SiC is 10.2, which is not so different from that of Si, but its breakdown electric field is larger than that of Si by about one order of magnitude, as mentioned above. In the SiC device, therefore, an electric field that is ten times as high as that in the case of the Si device is applied to the gate insulating film.

Furthermore, the trench structure as shown in FIG. 10 includes corner portions 15a. The presence of the corner portions 15a prevents the SiC device from taking advantage of its high breakdown electric field since an electric field is concentrated at this corner portion. Namely, as voltage applied to the device is increased, the gate insulating film reaches its breakdown electric field before the semiconductor reaches its breakdown electric field, thus causing the device to break down.

Recently, Shenoy, J. N. et al. has reported in 54$^{th}$ Device Research Conference, Santa Barbara (1996) on a prototype of SiC vertical MOSFET having a high withstand voltage. FIG. 11 is a cross sectional view showing a part of the SiC vertical MOSFET. The report states that this semiconductor device is produced by double ion implantation, though no description is provided on details of the manufacturing method. In FIG. 11, p base region 23 and n source region 24 are formed by applying increased acceleration voltage upon ion implantation so as to introduce respective impurities to large depth, thereby solving the problem of diffusion of impurities as mentioned above. This SiC vertical MOSFET is in the form of a planar structure, and is therefore free from the above-described problem of the withstand voltage of the oxide film in the trench structure.

The double ion implantation method as described above, however, has the following problem. Namely, ion implantation (or the degree of introduction of ions) varies to a great extent in different directions, whereas diffusion of impurities occurs substantially in the same way in all directions. If ions are implanted in a selected region of the substrate using a mask, therefore, the amount of impurities introduced sideways from the edge of the mask is reduced. Namely, in FIG. 11, the lateral dimension of the p base region 23, i.e., the length of the channel region 30, is reduced relative to the thickness of the region 23 in the depth direction. With the length of the channel region 30 thus reduced, punch-through is more likely to occur, and the withstand voltage cannot be increased.

SUMMARY OF THE INVENTION

To solve the above problems, the method of the present invention provides a silicon carbide vertical MOSFET comprising: a first conductivity type silicon carbide substrate; a first conductivity type drift layer comprising silicon carbide, which is formed on the first conductivity type silicon carbide substrate; a second conductivity type base region formed in a selected region of a surface layer of the first conductivity type drift layer; a first conductivity type source region formed in a selected region of the second conductivity type base region; a gate electrode layer formed on a gate insulating film over at least a part of an exposed surface portion of the second conductivity type base region interposed between the first conductivity type source region and the first conductivity type drift layer; a source electrode formed in contact with surfaces of the first conductivity type source region and the second conductivity type base region; and a drain electrode formed on a rear surface of the silicon carbide substrate; wherein ion implantation of first conductivity type impurities for forming the first conductivity type source region is conducted using a first mask, and ion implantation of second conductivity type impurities for forming the second conductivity type base region is conducted using a second mask, the first mask having a larger width than the second mask.

In the vertical MOSFET as described above, the length of the channel region and the thickness of the second conductivity type base region can be independently controlled to desired values.

In particular, the width of the exposed surface portion of the second conductivity type base region interposed between the first conductivity type source region and the first conductivity type drift layer is preferably larger than the dimension of the second conductivity type base region as measured in a thickness direction of the first conductivity type drift layer. In this arrangement, punch-through at the channel region can be avoided, and the withstand voltage of the thus constructed MOSFET can be increased.

In one form of the vertical MOSFET of the present invention as described above, a part of at least the second conductivity type base region protrudes from a surface of the first conductivity type source region. In this arrangement, the width of the second conductivity type base region between the exposed surface portion of the first conductivity type drift layer and the first conductivity type source region can be set to a sufficiently large value.

The present invention also provides a method for manufacturing the silicon carbide vertical MOSFET as described above, wherein ions are implanted in selected regions of the first conductivity type drift layer, using different masks for forming the second conductivity type base region and first conductivity type source region, respectively, and the gate insulating film is formed after removing the masks and conducting heat treatment.

According to the above method, the gate insulating film and gate electrode layer are formed after ion implantation and activation of the implanted ions, thus making it possible to produce a planar type vertical MOSFET.

In the method of the present invention, the ion implantation of second conductivity type impurities for forming the second conductivity type base region is preferably conducted a plurality of times while varying an acceleration voltage. In this case, the thickness of the second conductivity type base region may be increased as desired.

In the above-described method, the first mask used during ion implantation of first conductivity type impurities for forming the first conductivity type source region may consist of the second mask used during ion implantation of second conductivity type impurities for forming the second conductivity type base region, and a spacer formed on side faces of the first mask. In this case, the length of the channel region can be controlled to a desired value suitably determining the width of the spacer, and therefore the device can be easily designed with increased freedom.

The present invention also provides another method for forming a silicon carbide vertical MOSFET, which includes the steps of: forming a first conductivity type drift layer comprising silicon carbide on a first conductivity type silicon carbide substrate; covering a part of the first conductivity type drift layer with a mask, and etching the first conductivity type drift layer to a given depth to form a protruding portion; implanting ions for forming a second conductivity type base region in a selected region of the first conductivity type drift layer; forming a spacer on side faces of the protruding portion formed as a result of etching of the first conductivity type drift layer; implanting ions for forming a first conductivity type source region in a selected region of the second conductivity type base region; and reducing a height of the protruding portion of the first conductivity type drift layer so as to provide a flat surface.

According to the above-described method, the protruding portion of the first conductivity type drift layer serves as a mask, and thus eliminates a need to form a thick mask made of another material that is selected to permit ion implantation of impurities at high acceleration voltage.

The present invention further provides a silicon carbide vertical MOSFET comprising: a first conductivity type silicon carbide substrate; a first conductivity type drift layer comprising silicon carbide, which is formed on the first conductivity type silicon carbide substrate; a second conductivity type base layer formed on the first conductivity type drift layer; a first conductivity type source region formed in a selected region of a surface layer of the second conductivity type base layer; a first conductivity type well region formed through the second conductivity type base layer to extend from a surface of the base layer to the first conductivity type drift layer; a gate electrode layer formed on a gate insulating film over at least a part of an exposed surface portion of the second conductivity type base layer interposed between the first conductivity type source region and the first conductivity type well region; a source electrode formed in contact with surfaces of the first conductivity type source region and the second conductivity type base layer; and a drain electrode formed on a rear surface of the silicon carbide substrate. In this arrangement, ions of second conductivity type impurities need not be implanted to form the second conductivity type base layer, and therefore the MOSFET can be more easily manufactured.

In the vertical MOSFET as described above, the first conductivity type may be n type, and the second conductivity type may be p type. In this case, the vertical MOSFET can be easily manufactured since the second conductivity type base layer is formed by epitaxial growth, without requiring ion implantation of p type impurities that are difficult to be activated.

The present invention provides a method for manufacturing the silicon carbide vertical MOSFET as described just above, which includes the steps of forming a first conductivity type drift layer comprising silicon carbide and a second conductivity type base layer on a first conductivity type silicon carbide substrate by epitaxial growth, to provide a substrate; forming a first mask on a surface of the second conductivity type base layer; forming a second mask on the surface of the base layer such that the second mask overlaps the first mask, implanting ions for forming a first conductivity type source region in a selected region of a surface layer of the second conductivity type base layer, using the first mask and the second mask; forming a third mask on the surface of the second conductivity type base layer such that the third mask overlaps the first mask; and implanting ions for forming a first conductivity type well region in a selected region of the surface layer of the second conductivity type base layer, using the first mask and the third mask, so that the well region extends from the surface of the second conductivity type base layer to the first conductivity type drift layer through the base layer.

BRIEF DESCRIPTION OF THE DRAWINGS

The invention will be described in greater detail with reference to preferred embodiments thereof and the accompanying drawings, wherein:

FIGS. 2(a) through FIG. 2(f) are cross sectional views showing process steps in a method for manufacturing the silicon carbide vertical MOSFET of the first embodiment of the present invention;

DETAILED DESCRIPTION OF THE PREFERRED EMBODIMENTS

Some embodiments of the present invention will be described in detail. It is, however, to be noted that no description will be provided on process steps that are similar to those of the known method of FIG. 9 and process steps that have no relation with the present invention.

First Embodiment

Figure 1:
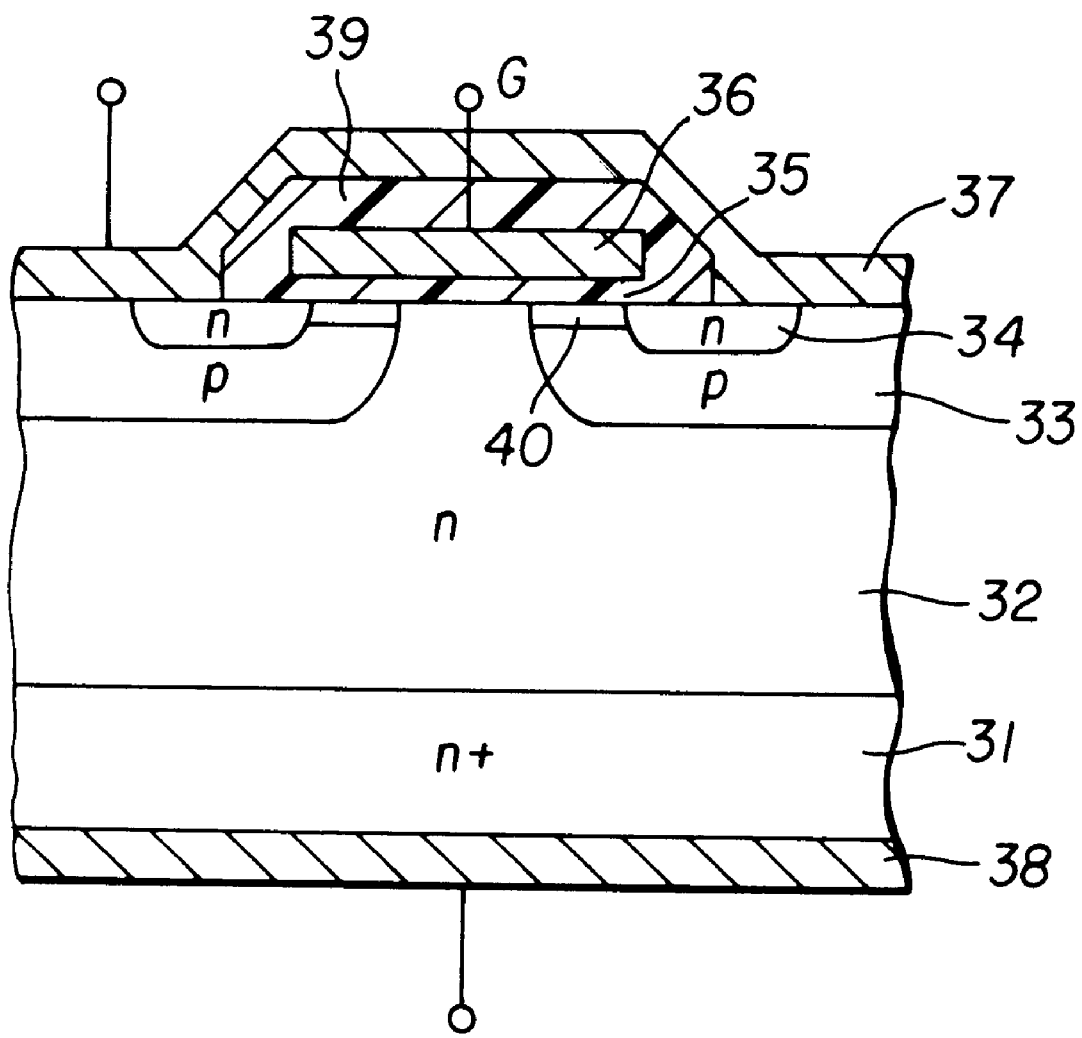
FIG. 1 is a cross sectional view of a silicon carbide vertical MOSFET according to the first embodiment of the present invention.

FIG. 1 is a cross sectional view showing a silicon carbide MOSFET constructed according to the first embodiment of the present invention.

Figure 11:
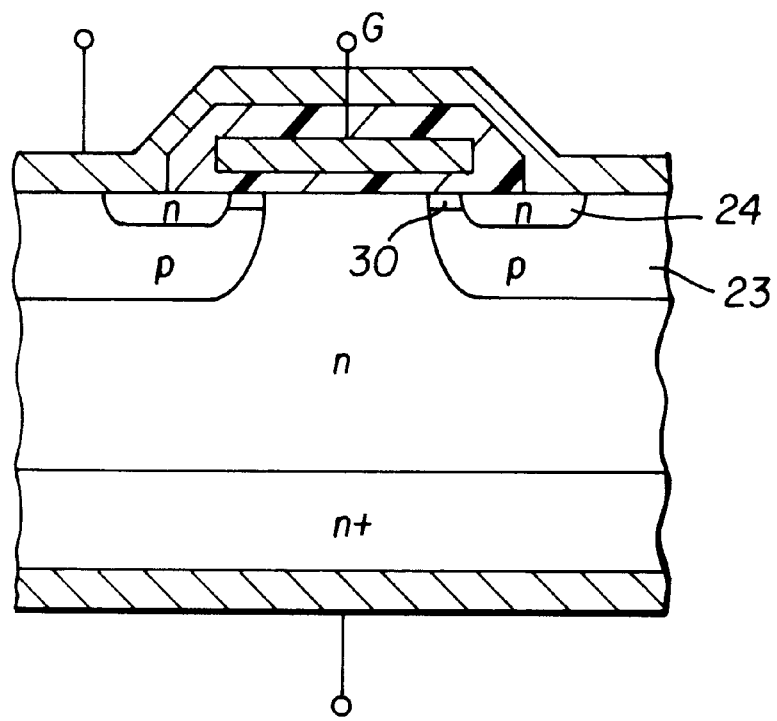
FIG. 11 is a cross sectional view of a known planer type silicon carbide MOSFET.

The basic structure of this embodiment is substantially identical with that of the planar type MOSFET of FIG. 11. More specifically, an n drift layer 32 is deposited by epitaxial growth on an $n^+$ silicon carbide substrate 31, and a p base region 33 is formed in a surface layer of the n drift layer 32 by implantation of boron ions while an n source region 34 is formed inside the p base region 33 by implantation of phosphorous ions. A gate electrode layer 36 made of polycrystalline silicon is formed on a gate insulating film 35 over exposed surface portions of p base regions 33 and n drift layer 32 interposed between two n source regions 34. A source electrode 37 is formed in contact with both of the n source region 34 and p base region 33, and a drain electrode 38 is formed in contact with the rear surface of the $n^+$ silicon substrate.

The silicon carbide MOSFET of FIG. 1 is different from the planar type MOSFET of FIG. 11 in that the n source region 34 and p base region 33 are not formed in respectively selected regions using the same mask. In particular, a pattern of a mask used for forming the p base region 33 has a smaller width than that of a mask used for forming the n source region 34. As a result, the length of a channel region 40 that is an exposed surface portion of the p base region 33 interposed between the n source region 34 and n drift layer 32 becomes greater than that of the MOSFET in which the regions 33, 34 are formed by ion implantation using the same mask.

FIG. 2(a) through FIG. 2(f) are cross sectional views showing the process of manufacturing the silicon carbide MOSFET of the first embodiment shown in FIG. 1, more particularly, the process of forming the junction structure as in FIGS. 9(a)–9(f).

Initially, the n drift layer 32 is laminated on the n$^+$ silicon carbide substrate 31 by epitaxial growth, and a polycrystalline silicon layer 36a is deposited by reduced-pressure CVD on the surface of the n drift layer 32, and formed in a given pattern by photolithography to provide a mask for ion implantation, as shown in FIG. 2(a). The thickness of the polycrystalline silicon layer 36a is 5 $\mu$m. The mask needs to be formed of a material, such as polycrystalline silicon, that can withstand high temperature during ion implantation.

Using the mask as described above, phosphorous ions are implanted so as to form the n source region. The implantation conditions are as follows: the acceleration voltages are 20 keV and 140 keV, the dose amount is $3\times10^{15}$ cm$^{-2}$, and the implantation temperature is 1000° C.

Then, a polycrystalline silicon layer 36b is formed again in another pattern by photolithography, and boron ions 33a are implanted so as to form the p base region, as shown in FIG. 2(c). The implantation conditions are as follows: the acceleration voltages are 40 keV, 120 keV, 400 keV and 1 MeV, the dose amount is $3\times10^{13}$ cm$^{-2}$, and the implantation temperature is 1000° C.

After removing the polycrystalline silicon layer 36b as a mask material by dry etching using a mixed gas of carbon tetrafluoride ($CF_4$) and oxygen ($O_2$), heat treatment is conducted for two hours at 1600° C., to activate the impurities thus implanted, thereby to form the p base region 33 and n source region 34, as shown in FIG. 2(d). Although diffusion of the impurities hardly occurs in the SiC substrate in normal conditions, the impurities are activated and diffused in this case due to the high acceleration voltages, so that the junction depth of the p base region 33 is about 2 $\mu$m, and the junction depth of the n source region 34 is about 0.2 $\mu$m.

Subsequently, the gate insulating film 35a having a thickness of 50 nm is formed by conducting thermal oxidation for two hours at 1200° C., and an approximately 1 $\mu$m-thickness polycrystalline silicon layer 36c, that provides the gate electrode layer, is deposited on the gate insulating film 35 by reduced-pressure CVD, as shown in FIG. 2(e). The polycrystalline silicon layer 36c is then formed in a given pattern by photolithography, to thus provide the gate electrode layer 36, as shown in FIG. 2(f).

After covering the gate electrode layer 36 with an insulating protective film, such as phosphorous glass, an opening is formed through the insulating protective film, and aluminum alloy is vapor-deposited and patterned to form the source electrode and gate electrode (not illustrated). In the meantime, the drain electrode is formed on the rear surface of the n$^+$ silicon substrate. Thus, the process for fabricating the vertical MOSFET is finished.

Referring back to FIG. 1 showing the silicon carbide MOSFET, a voltage is applied to the gate electrode layer 36 on the gate insulating layer 35, so that a channel 40 is induced in a surface portion of the p base region 33, and the n source region 34 and n drift layer 32 are electrically shorted. As a result, current flows from the drain electrode 38 to the source electrode 37 in a manner similar to the operation of the known MOSFET of FIG. 11.

The silicon carbide vertical MOSFET of the first embodiment is characterized in that the depth of the p base region 33 may be set as desired to either a large value or small value, and thus the junction structure may be designed with increased freedom. For example, the length of the channel region becomes 0.3 $\mu$m when the p base region and n source region are formed by ion implantation using the same mask in the known method. In the present embodiment, on the other hand, different masks are used for forming these regions, so that the channel length becomes equal to about 1.0 $\mu$m. The resulting semiconductor device has a high withstand voltage of about 1000V, and punch-through at the channel region of this device can be advantageously avoided.

Also, the silicon carbide MOSFET formed by the above-described method is of a planar type, and is therefore free from the above-described problem encountered in the known trench type silicon carbide MOSFET, namely, the problem of excessive electric field applied to the gate insulating film. Thus, the device produced by the method of the present embodiment is less likely to break down.

The method for manufacturing the silicon MOSFET as shown in FIG. 2(a) through FIG. 2(f) is different from that as shown in FIG. 9(a) through FIG. 9(f) in that the gate electrode layer is not formed in self alignment with the n source layer or p base region. This does not cause any problem in the manufacture of high-voltage devices that do not require high-frequency operations. The method of the present embodiment is advantageous in that the n source region and p base region can be designed with increased freedom, and the length of the channel region is controlled with high accuracy, assuring stable characteristics and a high yield.

Since the mask used upon implantation of boron ions is smaller than the mask used upon implantation of phosphorous ions, only one formation of the mask material is required if phosphorous ions are implanted earlier than boron ions as in the present embodiment. If the mask material is formed twice, the boron ions for forming the p base region may be implanted first, followed by ion implantation for forming the n source region.

Second Embodiment

FIG. 3(a) through FIG. 3(g) are cross sectional views showing process steps in another method of manufacturing a silicon carbide vertical MOSFET according to the present invention. The process will be described below step by step.

Figure 3A:
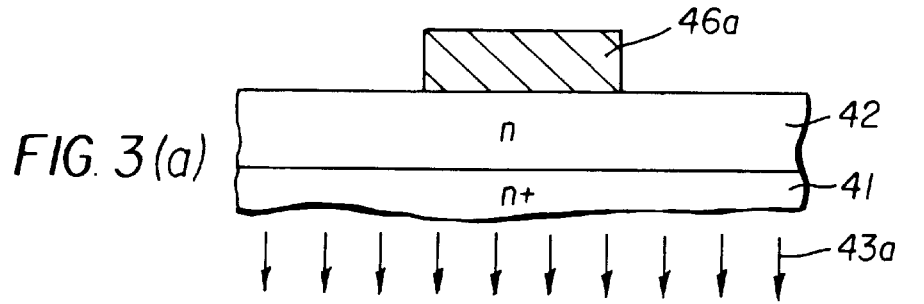
FIG. 3(a) through FIG. 3(g) are cross sectional views showing process steps in a method for manufacturing a silicon carbide vertical MOSFET according to the second embodiment to the present invention.

Initially, an n drift layer 42 is laminated on an n$^+$ silicon carbide substrate 41 by epitaxial growth, and a polycrystalline silicon layer 46a is deposited on the surface of the n drift layer 42 by reduced-pressure CVD, and patterned by photolithography to form a mask for ion implantation, as shown in FIG. 3(a). The thickness of the polycrystalline silicon layer 46a is 5 $\mu$m.

Figure 3B:
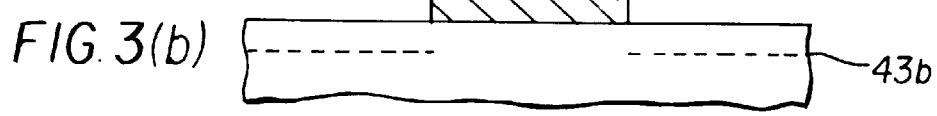

Subsequently, boron ions 43a are implanted, as shown in FIG. 3(b). The implantation conditions are as follows: the acceleration voltages are 40 keV, 120 keV, 400 keV and 1 MeV, the total dose amount is $3\times10^{13}$ cm$^{-2}$, and the implantation temperature is 1000° C. In FIG. 3(b), reference numeral 43b denotes boron atoms thus implanted.

Figure 3C:
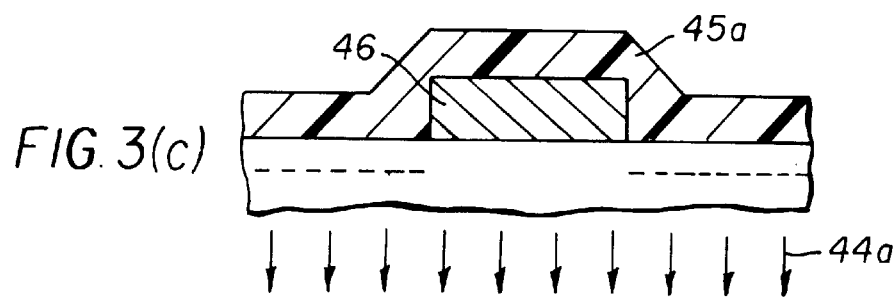
Figure 3D:

Subsequently, a silicon dioxide film 45a is deposited by normal-pressure CVD, as shown in FIG. 3(c), and this film 45a is then subjected to reactive ion etching, using a mixed gas of carbon tetrafluoride and hydrogen. As a result of the reactive ion etching which is a type of anisotropic ion etching, a spacer 45b having a thickness of about 0.5 μm is formed on side faces of the mask formed by the polycrystalline silicon layer 46a. Then, phosphorous ions 44a are implanted, using these spacer 45b and polycrystalline silicon layer 46a as a mask. The acceleration voltages are 20 keV and 140 keV, and the total dose amount is $3\times10^{15}$ cm$^{-2}$. In FIG. 3(d), reference numeral 44b denotes phosphorous atoms thus implanted.

Figure 3E:
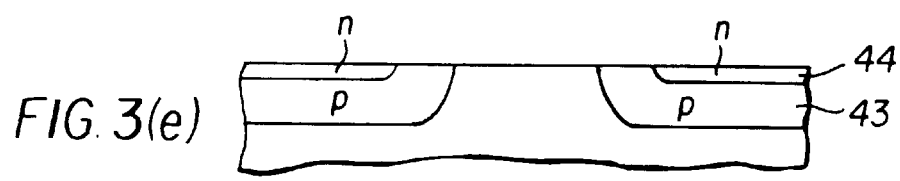

After removing the polycrystalline silicon layer 46a and spacer 45b as a mask material by dry etching using a mixed gas of carbon tetrafluoride and hydrogen, heat treatment is conducted for two hours at 1600° C., to activate the impurities and form the p base region 43 and n source region 44, as shown in FIG. 3(e). The depth of the junction between the p base region 43 and n drift layer 42 is about 2 μm, and the depth of the junction between the n source region 44 and the p base region 43 is about 0.2 μm. Since the spacer 45b formed on the side faces of the polycrystalline silicon layer 46a determines differences in the dimensions between the p base region 43 and n source region 44, the length of channel region 40 can be uniformly controlled with high accuracy, assuring stable characteristics of the resulting device and a higher yield in the manufacture thereof.

Figure 3F:
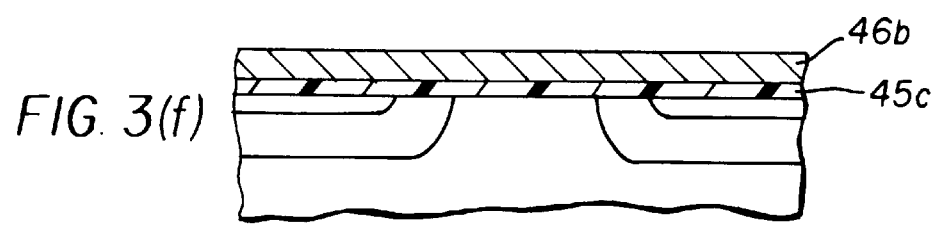
Figure 3G:
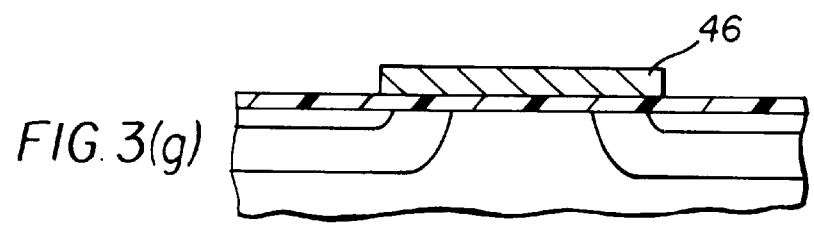

The process following the above steps is similar to that of the first embodiment of FIG. 2. Namely, a gate oxide film 45c is formed by thermal oxidation, and a polycrystalline silicon layer 46b having a thickness of about 1 μm is deposited on the gate oxide film 45c by reduced-pressure CVD, as shown in FIG. 3(f). The polycrystalline silicon layer 46b is then patterned by photolithography, to form a gate electrode layer 46, as shown in FIG. 3(g).

While the method of manufacturing the silicon carbide vertical MOSFET according to the second embodiment is somewhat different from that of the first embodiment, the resulting structure and its operation of this embodiment are almost the same as those of the first embodiment.

Similar to the first embodiment, the silicon carbide vertical MOSFET produced according to the method of the second embodiment is characterized in that the depths of the p base region 43 and n source region 44 and the length of the channel region may be controlled to desired values, and the junction structure may be designed with increased freedom. For example, the length of the channel region is equal to about 0.3 μm when the ions are implanted using the same mask to form the p base region and n source region, whereas the length of the channel region 40 is equal to about 1.0 μm in the present embodiment in which the spacer 45b is used to define a difference in the depth between the p base region 43 and the n source region 44. With the length of the channel region thus increased, the resulting device is given a withstand voltage as high as about 1000V, and punch-through can be avoided at the channel region of the device.

As an alternative method, phosphorous ions may be implanted first to form the n source region 44, using the polycrystalline silicon layer 46a and the spacer 45b as a mask, and, after removing the spacer 45b, boron ions may be implanted to form the p base region 43 using only the polycrystalline silicon layer 46a as a mask.

Third Embodiment

FIG. 4(a) through FIG. 4(f) and FIG. 5(a) through FIG. 5(d) are cross sectional views showing the process of manufacturing a silicon carbide MOSFET according to the third embodiment of the present invention.

Figure 4A:
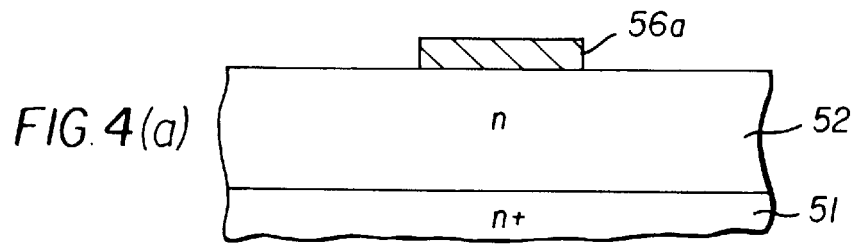
FIG. 4(a) through FIG. 4(f) are cross sectional views showing process steps in a method for manufacturing a silicon carbide vertical MOSFET according to the third embodiment of the present invention.
Figure 4B:
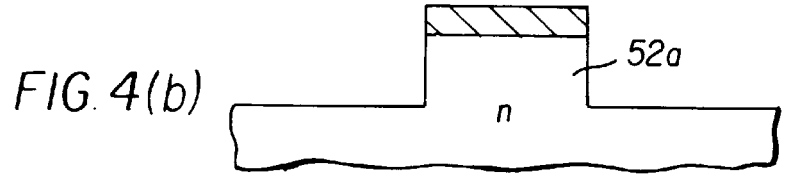

Initially, an n drift layer 52 is laminated on an n$^+$ silicon carbide substrate 51 T by epitaxial growth, and a silicon nitride film 56a is deposited on the surface of the n drift layer 52 by plasma CVD, and patterned by photolithography to form a mask for etching, as shown in FIG. 4(a).

Using the silicon nitride film 56a as a mask, the surface layer of the SiC substrate is etched to a depth of about 5 μm, by reactive ion etching using a mixed gas of carbon tetrafluoride and oxygen, so as to form a protruding portion 52a.

Figure 4C:
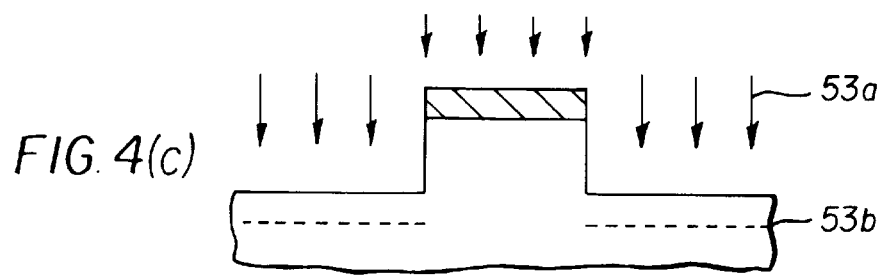
Figure 4D:
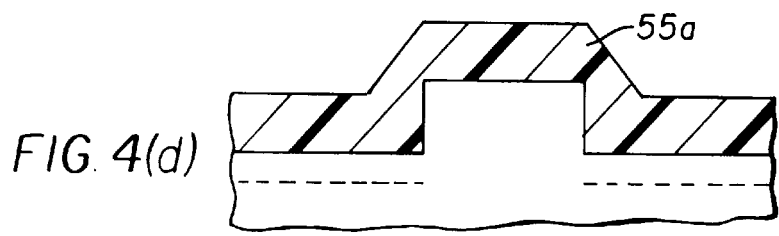

In the next step shown in FIG. 4(c), boron ions 53a are implanted with the patterned silicon nitride film 56a left on the protruding portion 52a. The acceleration voltages and dose amount may be controlled to be at substantially the same level as those of the first embodiment. In FIG. 4(c), reference numeral 53b are boron atoms thus implanted. Some boron ions 53a may be introduced into the protruding portion 52a. Then, after removing the silicon nitride film 56a, a silicon dioxide film 55a is deposited by normal-pressure CVD, as shown in FIG. 4(d).

Figure 4E:
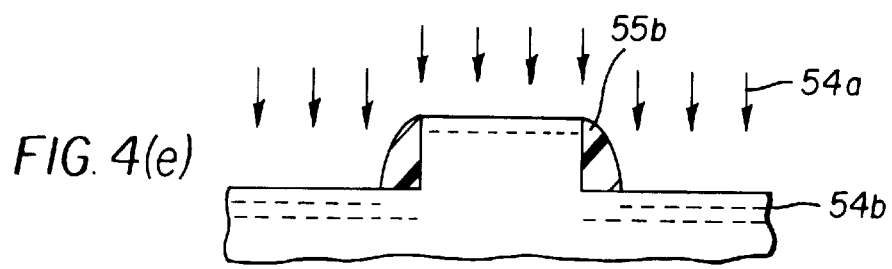

Subsequently, the entire surface of the silicon dioxide film 55a thus deposited is subjected to reactive ion etching using a mixed gas of carbon tetrafluoride and hydrogen, to form a 0.5 μm-thickness spacer 55b on side faces of the protruding portion 52a. Then, phosphorous ions 54a are implanted, using the spacer 55b and the protruding portion 52a as a mask, as shown in FIG. 4(e). The acceleration voltage and dose amount may be controlled to be substantially at the same level as those of the first embodiment. In FIG. 4(e), reference numeral 54b denotes phosphorous atoms thus implanted. Some phosphorous ions may be introduced into the surface layer of the protruding portion 52a.

Figure 4F:
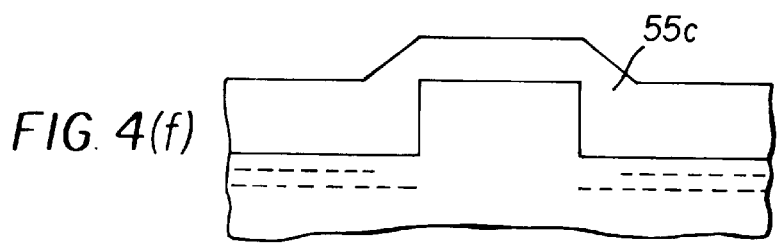

Thereafter, the spacer 55b is removed, and the surface is coated with a photoresist 55c, as shown in FIG. 4(f), such that a portion of the photoresist 55c on the protruding portion 52a has a relatively small thickness and the other portion has a relatively large thickness.

Figure 5A:
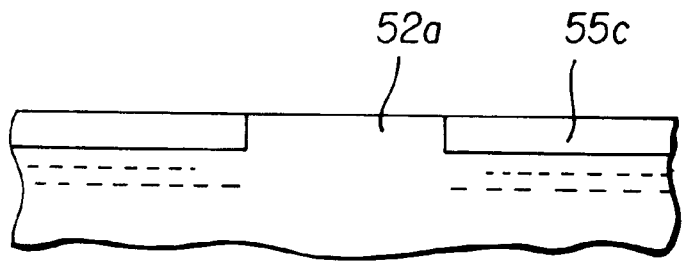
FIG. 5(a) through FIG. 5(d) are cross sectional views showing process steps following the step of FIG. 4(f)

In the next step, reactive ion etching is conducted using a mixed gas of carbon tetrafluoride and oxygen, under such etching conditions that the photoresist 55c and the protruding portion 52a are etched at almost the same rate, to thus provide a substantially flat surface, as shown in FIG. 5(a). Protrusions and recesses on this surface are made as small as possible, for example, controlled to be in a range of 0.1 to 0.2 μm. Instead of etching, this flat surface may be formed by mechanical grinding.

Figure 5B:
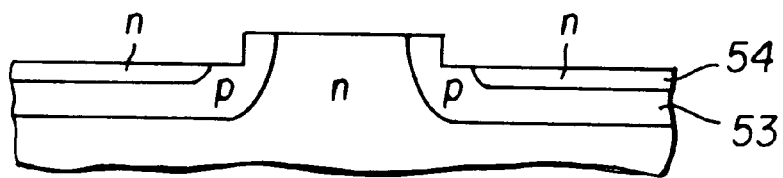
Figure 5C:
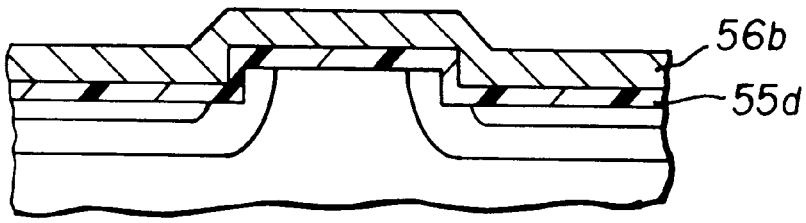
Figure 5D:
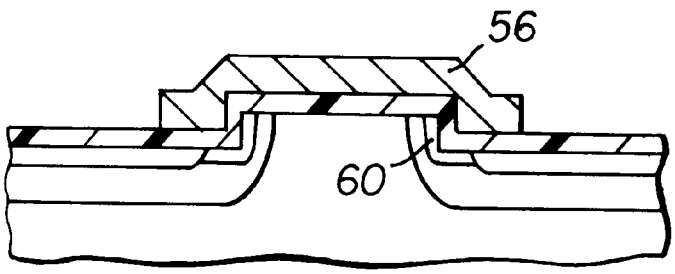

In the next step shown in FIG. 5(b), the photoresist 55c remaining on the surface is removed, and heat treatment is conducted for two hours at 1600° C. The process following this step is similar to that of the first embodiment. Namely, a gate oxide film 55d is formed by thermal oxidation, and a polycrystalline silicon layer 56b that provides a gate electrode layer 56 is deposited on the gate oxide film 55d by reduced-pressure CVD, as shown in FIG. 5(c). The gate electrode layer 56 is then formed in a given pattern, as shown in FIG. 5(d).

Similarly to the first and second embodiments, the third embodiment is characterized in that the depths and other dimensions of the p base region 53 and n source region 54 may be freely controlled to desired values, thus allowing the junction structure to be designed with increased freedom.

Furthermore, the third embodiment is characterized in the use of the n drift layer 52 itself as a mask for forming the p base region in a selected region of the substrate. In the first and second embodiments, it is difficult to find an appropriate material to be used as a mask material, and ions cannot be introduced so deeply that they penetrate through the mask material. If the n drift layer 52 itself is used as the mask material as in the present embodiment, no problem arises in terms of the stability and limit to the thickness.

Fourth Embodiment

Figure 6:
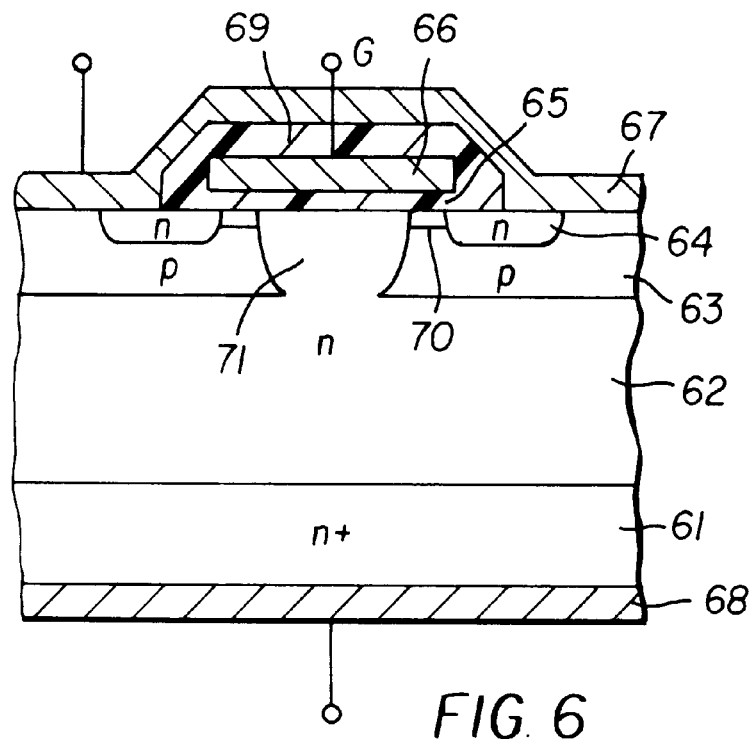
FIG. 6 is a cross sectional view of a silicon carbide vertical MOSFET according to the fourth embodiment of the present invention.
Figure 7:
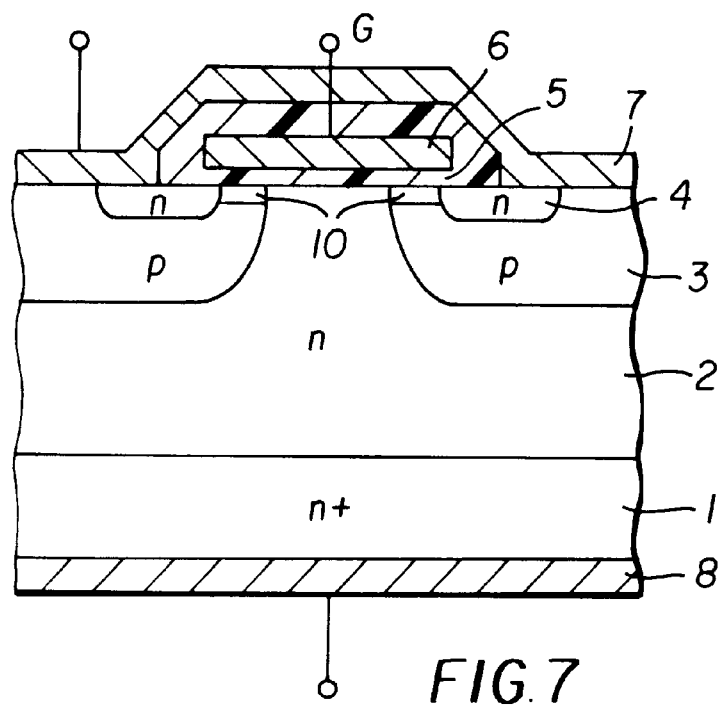
FIG. 7 is a cross sectional view showing a known vertical MOSFET having a silicon substrate.

FIG. 6 is a cross sectional view showing a silicon carbide MOSFET according to the fourth embodiment of the present invention.

In this silicon carbide MOSFET, an n drift layer 62 and a p base layer 63 are laminated on an n$^+$ substrate 61 by epitaxial growth, and an n source region 64 is formed in a surface layer of the silicon carbide substrate by implantation of phosphorous ions. In a portion of the surface layer of the substrate in which the n source region 64 is not formed, an n well region 71 is formed through the p base layer 63 to reach the n drift layer 62. A gate electrode layer 66 made of polycrystalline silicon is formed on a gate insulating film 65 over a surface of the p base layer 63 that is interposed between the n well region 71 and n source region 64. Further, a source electrode 67 is formed in contact with surfaces of both of the n source region 64 and p base layer 63, and a drain electrode 68 is formed in contact with the rear surface of the n$^+$ substrate 61.

FIG. 8(a) through FIG. 8(g) are cross sectional views showing the process of manufacturing the silicon carbide MOSFET of the fourth embodiment.

Figure 8A:
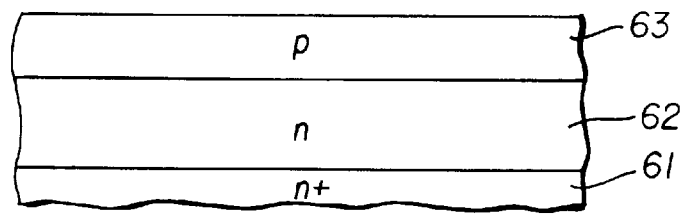
FIG. 8(a) through FIG. 8(g) are cross sectional views showing process steps in a method for manufacturing the silicon carbide vertical MOSFET of the fourth embodiment of the present invention.
Figure 8B:
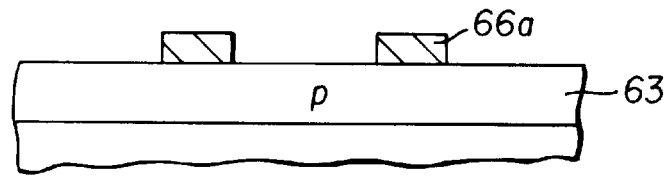

Initially, the n drift layer 62 having a thickness of 10 μm is laminated on the n$^+$ silicon carbide substrate 61 by epitaxial growth, and then the p base layer 63 having a thickness of 2 μm is epitaxially grown on the n drift layer 62, as shown in FIG. 8(a). In the next step shown in FIG. 8(b), a polycrystalline silicon layer having a thickness of 4 μm is deposited on the surface of the p base layer 63 by reduced-pressure CVD, and then patterned to form a first mask 66a. This mask is used during ion implantation for forming both the n source region 64 and n well region 71 as described below.

Figure 8C:
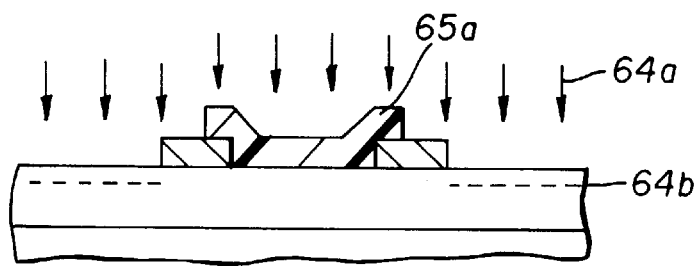

With the mask 66a left on the p base layer 63, an oxide film is deposited on the substrate by a CVD method, and patterned by photolithography to form a second mask 65a, and phosphorous ions 64a are implanted in the p base layer 63 so as to form the n source region 64, as shown in FIG. 8(c). Since the edge of the mask is defined by that of the first mask 66a, the second mask 65a may be patterned with reduced accuracy. The conditions of ion implantation may be similar to those under which the n source region of the first embodiment is formed. In FIG. 8(c), reference numeral 64b denotes phosphorous atoms thus implanted.

Figure 8D:
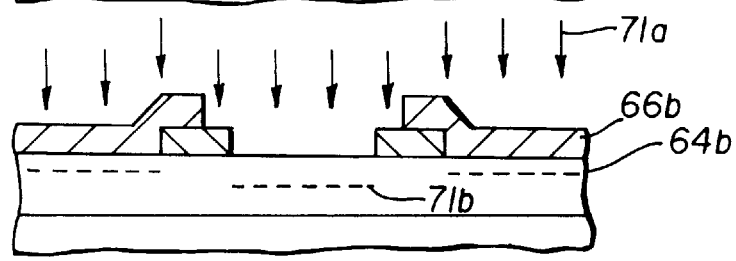

After implantation of phosphorous ions, the second mask 65a is removed, and polycrystalline silicon is deposited again by reduced-pressure CVD, and patterned by photolithography to form a third mask 66b. Using the first mask 66a and third mask 66b thus formed, phosphorous ions 71a are implanted into the p base layer 63 as shown in FIG. 8(d) so as to form the n well region 71 that extends through the p base layer 63. Since the edge of the resulting mask is defined by that of the first mask 66a, the third mask 66b may be formed with reduced accuracy. The conditions of ion implantation are as follows: the acceleration voltages are 40 keV, 120 keV, 400 keV and 1 MeV, the total dose amount is $3 \times 10^{13}$ cm$^{-2}$, and the implantation temperature is 1000° C. In FIG. 8(d), reference numeral 71b denotes phosphorous atoms thus implanted.

Figure 8E:
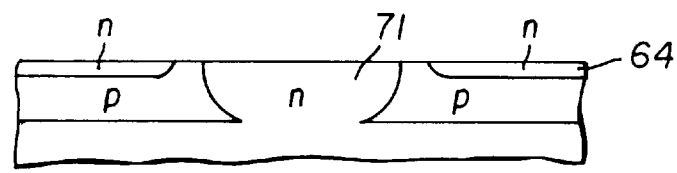

After removing the first and third masks 66a, 66b by dry etching using a mixed gas of carbon tetrafluoride (CF$_4$) and oxygen (O$_2$), heat treatment is conducted for two hours at 1600° C., to activate the impurities so as to form the n source region 64 and n well region 71, as shown in FIG. 8(e). The depth of the junction between the p base layer 63 and the n source region 64 is about 0.2 μm.

Figure 8F:
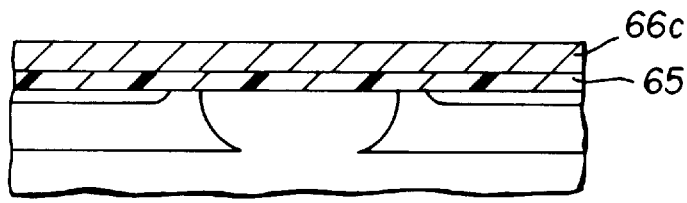
Figure 8G:
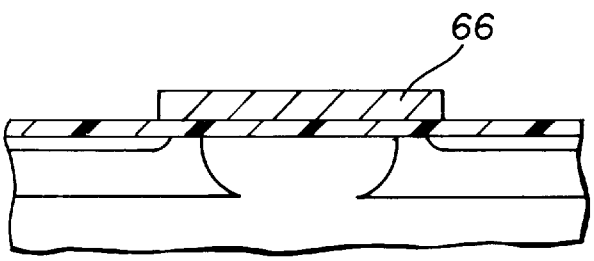
Figure 9A:
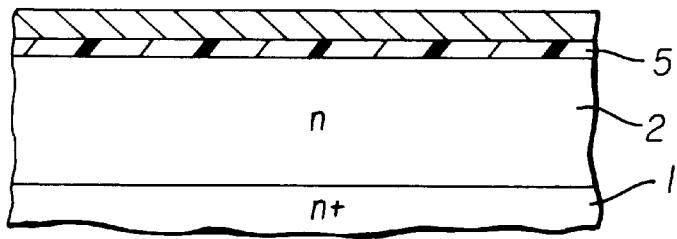
FIG. 9(a) through FIG. 9(f) are cross sectional views showing process steps for producing the silicon vertical MOSFET of FIG. 7.
Figure 9B:
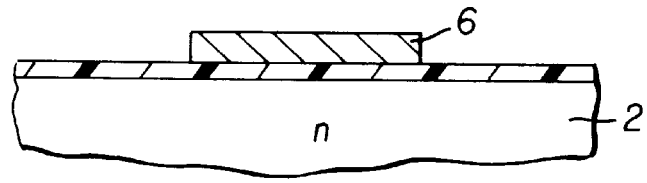
Figure 9C:
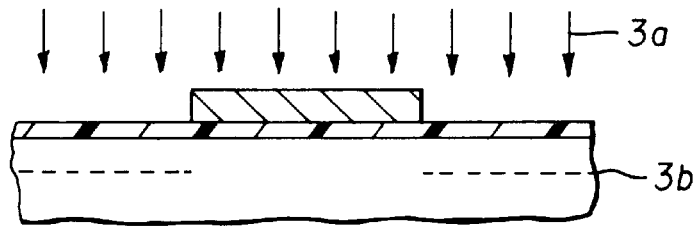
Figure 9D:
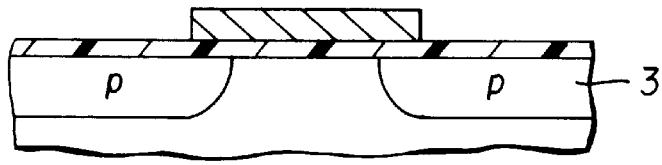
Figure 9E:
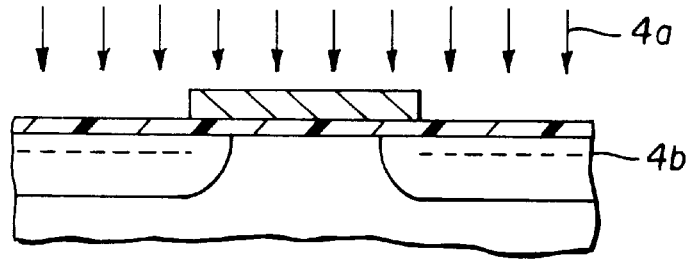
Figure 9F:
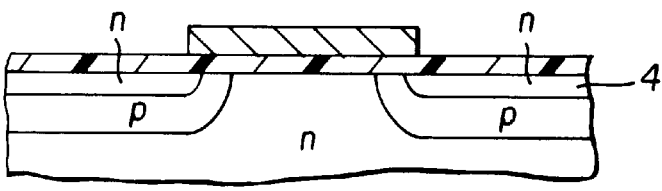
Figure 10:
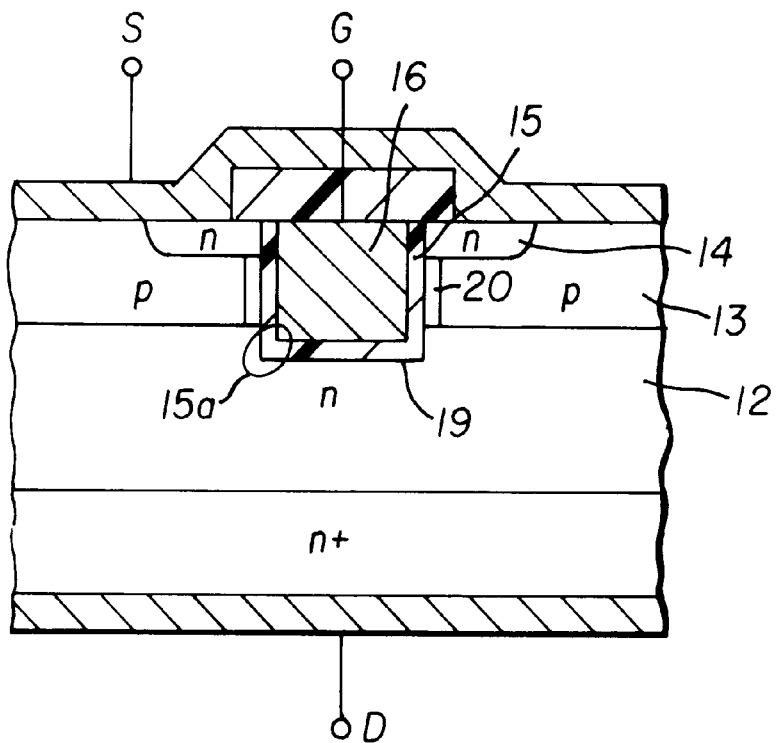
FIG. 10 is a cross sectional view of a trench type silicon carbide MOSFET.

Thereafter, the gate insulating film 65 having a thickness of 60 nm is formed by thermal oxidation, and polycrystalline silicon layer 66c is deposited on the gate insulating film 65 by reduced-pressure CVD, and is patterned by photolithography to form the gate electrode layer 66, as shown in FIG. 8(f) and FIG. 8(g).

In the next step that is not illustrated, phosphorous glass is deposited by reduced-pressure CVD to form an insulating film, and an opening is formed through the insulating film, so that the source electrode is formed in contact with the n source region 64. At the same time, a gate electrode is formed in contact with the gate electrode layer 66, and the drain electrode 68 is formed on the rear surface of the n$^+$ silicon carbide substrate 61.

In the silicon carbide MOSFET of the fourth embodiment, the width of the p base layer interposed between the n source region 64 and n well region 71, namely, the length of the channel region 70, can be uniformly set to a desired value with high accuracy by suitably controlling the width of the first mask 66a. Thus, the above-described process is advantageously employed to form a high voltage silicon carbide MOSFET in which impurities are less likely to be diffused, as compared with the known process in which the n source region and p base region are formed by self alignment using the edge of the same mask.

The silicon carbide MOSFET of the fourth embodiment shown in FIG. 6 is different from that of the first embodiment shown in FIG. 1 in that the p base layer 63 is formed by epitaxial growth, and the n well region 71 that extends through the p base layer 63 is formed by ion implantation. This method does not require implantation of ions as p-type impurities that are normally difficult to be implanted and activated in the SiC substrate, and therefore the silicon carbide MOSFET can be manufactured by this method with a considerably improved efficiency.

While the silicon carbide MOSFET of the illustrated embodiments are of n-channel type, the present invention may be equally applied to a MOSFET in which the conductivity types are reversed with respect to those of the illustrated embodiments.

While phosphorous and boron are used as n-type and p-type impurities, respectively, in the illustrated embodiments, nitrogen or arsenic may be used as n-type impurities, and aluminum may be used as p-type impurities.

According to the present invention as explained above, the first conductivity type source region of the silicon carbide vertical MOSFET is formed by ion implantation of first conductivity type impurities in a selected region of the first conductivity type drift layer, using a mask that has a larger width than a mask used during ion implantation of second conductivity type impurities in a selected region of the drift layer. Thus, the length of the channel and the thickness of the second conductivity type base region can be independently controlled to desired values, to thus provide a structure that has a high withstand voltage and is free from punch through at the channel region.

The above vertical MOSFET is manufactured by implanting ions in selected regions of the first conductivity type drift layer, using different masks for forming the second conductivity type base region and first conductivity type source region, respectively, and forming a gate insulating film after removing the masks and conducting heat treatment. The silicon carbide vertical MOSFET produced according to this method has reduced stresses due to an electric field applied to the gate insulating film, and is thus able to withstand a sufficiently high voltage.

If a spacer is used to form one of the above masks, the length of the channel region can be controlled with high accuracy, assuring stable characteristics of the MOSFET and an increased yield in the manufacture thereof.

In another manufacturing method, the first conductivity type well region is formed by ion implantation such that this well region extends from the surface of the second conductivity type base region to the first conductivity type drift layer, and the first conductivity type source region is formed by ion implantation in a selected region of the surface layer of the second conductivity type base layer. Since this method does not require ion implantation of second conductivity impurities for forming the second conductivity type base layer, the silicon carbide vertical MOSFET may be manufactured with improved efficiency.

What is claimed is:

1. A method for manufacturing a silicon carbide vertical MOSFET, comprising the steps of:

forming a first conductivity type drift layer comprising silicon carbide on a first conductivity type silicon carbide substrate;

forming a first mask on said first conductivity type drift layer;

forming a first conductivity type source region in a selected region of a surface layer of said first conductivity type drift layer, by ion implantation of first conductivity type impurities using said first mask;

forming a second mask by reducing a width of said first mask;

forming a second conductivity type base region in a selected region of said first conductivity type drift layer, by ion implantation of second conductivity type impurities using said second mask;

removing said second mask that remains on said first conductivity type drift layer, and conducting heat treatment;

forming a gate electrode layer on a gate insulating film over at least a part of an exposed surface portion of said second conductivity type base region interposed between said first conductivity type source region and said first conductivity type drift layer, forming a source electrode in contact with surfaces of said first conductivity type source region and said second conductivity type base region; and forming a drain electrode on a rear surface of said silicon carbide substrate.

2. A method according to claim 1, wherein at least one of said ion implantations is conducted while varying an acceleration voltage.

3. A method for manufacturing a silicon carbide vertical MOSFET, comprising the steps of:

forming a first conductivity type drift layer comprising silicon carbide on a first conductivity type silicon carbide substrate;

covering a part of said first conductivity type drift layer with a mask, and etching the first conductivity type drift layer to a given depth to form a protruding portion;

implanting ions for forming a second conductivity type base region in a selected region of a surface layer of said first conductivity type drift layer;

forming a spacer on side faces of said protruding portion formed as a result of etching of said first conductivity type drift layer;

implanting ions for forming a first conductivity type source region in a selected region of said first conductivity type drift layer;

removing said spacer and reducing a height of said protruding portion of said first conductivity type drift layer formed as a result of etching;

forming a gate electrode layer on a gate insulating film over at least a part of an exposed surface portion of said second conductivity type base region interposed between said first conductivity type source region and said first conductivity type drift layer;

forming a source electrode in contact with surfaces of said first conductivity type source region and said second conductivity type base region; and forming a drain electrode on a rear surface of said silicon carbide substrate.

4. A method for manufacturing a silicon carbide vertical MOSFET, comprising the steps of:

forming a first conductivity type drift layer on a first conductivity type silicon carbide substrate by epitaxial growth, forming a second conductivity type base layer on said first conductivity type drift layer by epitaxial growth;

forming at least two first masks on a surface of said second conductivity type base layer;

forming a second mask on the surface of said second conductivity type base layer such that the second mask overlaps said first masks (between said first masks);

implanting ions for forming a first conductivity type source region in a selected region of a surface layer of said second conductivity type base layer, using said first masks and said second mask;

forming at least two third masks on the surface of said second conductivity type base layer such that each of said third masks overlap said first masks at outer portions of said first masks;

implanting ions for forming a first conductivity type well region in a selected region of the surface layer of said second conductivity type base layer, using said first masks and said third masks, so that said first conductivity type well region extends from a surface of said second conductivity type base layer to said first conductivity type drift layer through said base layer;

forming a gate electrode layer on a gate insulating film over at least a part of an exposed surface portion of said second conductivity type base layer interposed between said first conductivity type source region and said first conductivity type well region;

forming a source electrode in contact with surfaces of said first conductivity type source region and said second conductivity type base layer; and forming a drain electrode on a rear surface of said first conductivity type silicon carbide substrate.

* * * * *